United States Patent Office 3,046,111

Patented July 24, 1962

3,046,111

PROCESS OF MAKING QUINONE DIAZIDE PRINTING PLATES

Maximilian Paul Schmidt, Wiesbaden-Biebrich, Germany, assignor, by mesne assignments, to Azoplate Corporation, Murray Hill, N.J.

No Drawing. Filed Jan. 2, 1962, Ser. No. 163,375
Claims priority, application Germany Feb. 1, 1950
8 Claims. (Cl. 96—33)

This invention relates to light sensitive materials suitable for the production of lithographic printing plates and for other purposes and in particular to positive working photosensitive materials of the type described in U.S. patent application Serial No. 174,556, filed July 18, 1950, by Maximilian Paul Schmidt, and now abandoned.

The application Serial No. 174,556 refers to the preparation of photosensitive material by coating a specific type of water-insoluble diazo compounds on a suitable material, the water-insoluble diazo compounds being derived from 2-diazo-naphthol-(1) or 1-diazo-naphthol-(2)—another well-known designation is naphthoquinone-(1,2)-diazide(2) and naphthoquinione-(1,2)-diazide(1), respectively—and having the chemical constitution of esters or amides of a sulfo acid or a carboxylic acid of these diazo naphthols. This sensitized material is then exposed to light through a master to decompose the diazo compound in the light struck areas and convert it into an alkali-soluble compound which is then removed by washing with an alkaline solution. Thus a positive image of undecomposed diazo compound is obtained from a positive original. This image may be heated to make it receptive to greasy printing inks so that the exposed and developed material may be used as a lithographic plate. Exposure to heat may not be necessary in order to increase the receptiveness of the image for greasy ink, if a resin or fatty acid or both are incorporated in the light sensitive layer with the diazo compound.

It has now been found that water-insoluble diazo compounds containing several naphthoquinone-(1,2)-diazide-residues in the molecule, obtained by the reaction of 1 mole of an amino-hydroxy compound with at least 2 moles of a naphthoquinone-(1,2)-diazide-sulfonic acid or its chloride or by the reaction of 1 mole of a compound containing several amino groups with at least 2 moles of the naphthoquinone-diazide-sulfonic acid component, may also be used in positive working photo-lithographic materials.

Such water-insoluble diazo compounds suitable for practicing the present invention correspond with the general formula

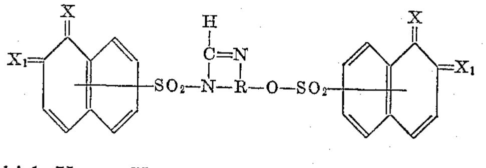

in which X and $X_1$ are $N_2$ or O, those attached to the same ring being different, and R is an arylene group.

The naphthalene nucleus of the naphthoquinone-(1,2)-diazide residues can be substituted, for example, with halogens. However, sulfonic acid groups should be omitted. Also stronger basic groups, such as amino- or dimethylamino groups, should preferably not be included because it is customary in the printing process to treat the printing plates with acids in order to keep the background clean.

The following compounds, which are referred to in the following examples, represent diazo compounds which are useful according to the present invention.

*Formula 1*

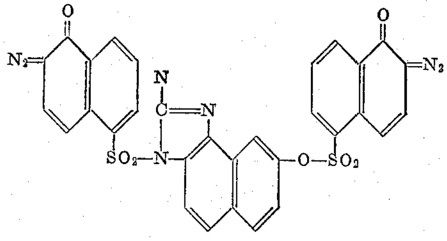

*Formula 2*

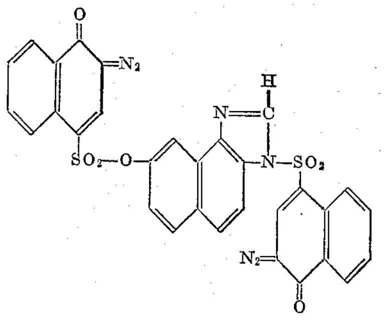

*Formula 3*

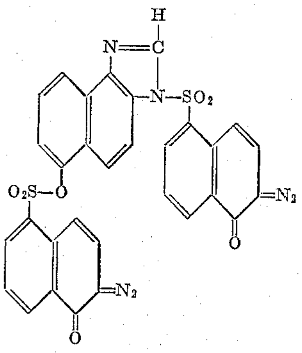

The images should be developed with alkaline solutions which are as weak as possible. Good results are generally obtained by using 3–5 percent trisodium phosphate solutions or disodium phosphate solutions of somewhat higher concentration. Aqueous solutions of other alkalies, as, for example, sodium carbonate or caustic soda, may also be used. Organic solvents such as alcohol may be added to these alkaline solutions. Generally, the weakest alkali capable of removing the background should be chosen.

If, after development, the image is heated until a change of color occurs, or if alkali-soluble resins or fatty acids or mixtures of both are incorporated into the light sensitive layer, it has been found that the receptive power of the positive diazo image for greasy printing ink may be still further improved.

The compounds for the lithographic material and process of this invention can be prepared by following known methods. In most cases, they can be obtained in a simple manner by the reaction in alkaline solution of the naphthoquinone - (1,2) - diazidesulfochlorides with an amino-hydroxy-compound or a compound containing several amino groups. If water insoluble components are used, an additional solvent may be added.

Most of the diazo compounds useful according to this invention are yellow products and generally it is difficult to dissolve them in the solvents which are commonly used. They dissolve more readily, for example, in dioxane, ethylene glycol monomethyl ether or methylethyl ketone, pyridine bases or combinations of these solvents. When diazo compounds are used which are very difficultly soluble in organic solvents, it is advisable to use them in admixture with more readily soluble diazo compounds in order to avoid the necessity for repeated coating of these produces on the support, to obtain a layer of sufficient thickness. The use of combinations of diazo compounds is often of advantage because crystalline precipitates may be avoided and smoother layers obtained. Furthermore, the use of combination of solvents may improve the clarity and smoothness of the layers as is well known in the preparation of lacquers and vanishes.

Since according to the described process a positive image is obtained by contact exposure through a positive original, it is of advantage that the diazo compounds decompose readily upon exposure to light. In order to obtain an extraordinarily clean background, chemical substances, such as thiourea, thiosinamine and organic acids in small quantities can be added. It is, however, desirable to use diazo compounds which are distinguished by a high capability of bleaching out or decomposing readily on exposure to light so that it is not necessary to add substances of the type mentioned before. The necessity of adding these substances can be determined by a short exposure to light. Resins or fatty acids can also be added to the light sensitive layers.

The base may consist of aluminum or zinc plates or foils or of lithographic stone or glass. Aluminum foils are especially suitable and they may or may not be provided with a thin layer of aluminum oxide by known chemical or electrolytic methods. The surface of aluminum or zinc plates and foils may be slightly roughened by mechanical means to improve adhesion of the light sensitive layer. Mover, other materials having a nonhydrophilic surface such as woven copper material may be used. In the latter case, alkali soluble resins and dyestuffs soluble in organic solvents may be added advantageously to the layer. According to this procedure colored images are obtained which can be etched exactly like those on zinc or glass plates, or, if foils or woven metal material has been chosen, the copies may be transformed into stencils.

1–3 percent solutions, applied to, preferably, aluminum or zinc plates, produce effective light sensitive materials for lithography. After the evaporation of the solvent, the light sensitive material is ready for use at once. It has good stability and can be stored for a long period of time.

The following examples are inserted in order to illustrate the present invention, but they are not intended to limit the scope thereof:

(1) 1 to 2 g. of the condensation product obtained from 1 mole of 7'-hydroxy-(naphtho-1',2':4,5-imidazole) and 2 moles of 2-diazonaphthol-(1)-5-sulfochloride (naphthoquinone-(1,2)-diazide-(2)-5-sulfochloride) of the probable Formula 1 is dissolved at about 90–100° C. in 100 cc. of ethylene glycol monomethyl ether. After cooling to room temperature the solution is applied to an aluminum plate which has been roughened by means of a brush. The coated plate is dried at 90–100° C. in a few minutes and exposed to a light image. The exposed material may be developed with a 3 percent solution of trisodium phosphate and washed with water. After the usual treatment with a gum solution or dilute phosphoric acid and after washing with water the plate can be used for printing immediately.

The condensation product is obtained by dissolving ½ mole (110 g.) of 7'-hydroxy-(naphtho-1',2':4,5-imidazole) hydrochloride in 1000 cc. of dioxane (diethylenedioxide) and 500 cc. of water. Then adding 125 g. of anhydrous sodium carbonate and subsequently adding a solution of 1 mole (268 g.) of naphthoquinone-(1,2)-diazide-(2)-5-sulfochloride in 1300 cc. of dioxane under constant stirring at 35° C. A sample of the reaction product is tested with a fast coupling diazo compound and if a dyestuff forms after a little while, small quantities of naphthoquinone-(1,2)-diazide-(2)-5-sulfochloride are added until the coupling reaction no longer occurs. The mixture is heated to 50° C. for a short period of time thereafter. Then the mixture is cooled down and a yellow compound begins to separate. The complete precipitation of the condensation product is effected by pouring the mixture into 4 liters of water. The product which separates is filtered off, washed with water and dried. It is insoluble in water, dilute acids and alkalies. When heated the condensation product beings to darken at a temperature of about 150° C. and chars at 280–300° C. It is difficulty soluble in the usual solvents but more readily soluble in pyridine and ethylene glycol monomethyl ether.

(2) To prepare the compound of Formula 2, 18.6 g. (1/10 mole) of 7'-hydroxy-naphtho-(1',2':4,5)-imidazole are dissolved in a mixture of 200 cc. of dioxane and 100 cc. of water, and a solution of 55 g. (1/5 mole) of naphthoquinone-(1,2)-diazide-(2)-sulfonic acid chloride-(4) in 250 cc. of dioxane is added. 250 cc. of a 10 percent sodium carbonate solution are added drop by drop to the mixture with vigorous stirring, while the temperature of the reaction mixture slowly rises to 45 to 50° C. By adding water to the warm reaction mixture, the compound corresponding to Formula 2 is precipitated. It is filtered off, washed with water and dried. The dried compound is yellow-brown in color.

(3) To prepare the compound of Formula 3, 18.6 g. (1/10 mole) of 8'-hydroxy-naphtho-(3',4':4,5)-imidazole are dissolved in a mixture of 200 cc. of dioxane and 100 cc. of water, and a solution of 55 g. (1/5 mole) of naphthoquinone-(1,2)-diazide-(2)-sulfonic acid chloride-(5) in 250 cc. of dioxane is added. 250 cc. of a 10 percent sodium carbonate solution are added drop by drop to the mixture with vigorous stirring, while the temperature of the reaction mixture slowly rises to 45 to 50° C. By adding water to the warm reaction mixture, the compound corresponding to Formula 3 is precipitated. It is filtered off, washed with water and dried. The dried compound is yellow-brown in color.

(4) To prepare planographic printing plates using either of the compounds of Formulas 2 and 3, the compound is dissolved in an organic solvent and coated onto a support, e.g., a foil of metal, following the general procedure of Example 1 above.

From this copying material, copies are obtained, following the general procedure of Example 1, by exposing the material to light under a master after which development is effected using, for the compound Formula 2, a 10 percent disodium phosphate solution and for the compound of Formula 3, a 3 percent trisodium phosphate solution. Positive images are obtained from positive masters.

This application is a continuation-in-part of application Serial No. 718,453, filed March 3, 1958, and now abandoned, which application is, in turn, a continuation-in-part of application Serial No. 517,086, filed June 21, 1955, now abandoned, which application was in turn a continuation-in-part of application Serial No. 208,055, filed January 26, 1951, and now abandoned.

It will be obvious to those skilled in the art that many modifications may be made within the scope of the present invention without departing from the spirit thereof, and the invention includes all such modifications.

What is claimed is:

1. A presensitized printing plate comprising a base material having a coating thereon comprising a compound having the formula

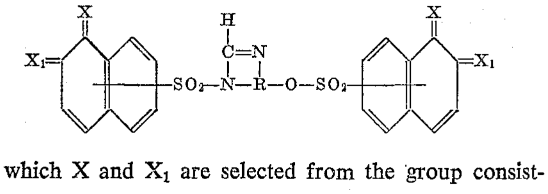

in which X and $X_1$ are selected from the group consisting of $N_2$ and O, those attached to the same ring being different, and R is an arylene group.

2. A presensitized printing plate comprising a base material having a coating thereon comprising a compound having the formua

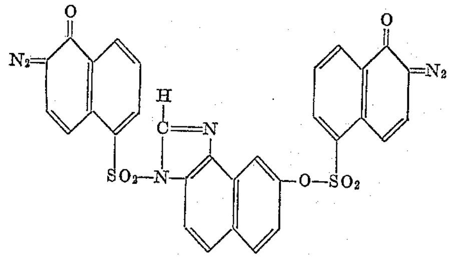

3. A presensitized printing plate comprising a base material having a coating thereon comprising a compound having the formula

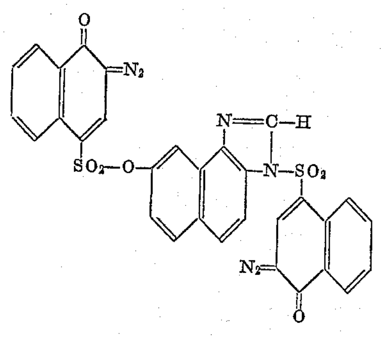

4. A presensitized printing plate comprising a base material having a coating thereon comprising a compound having the formula

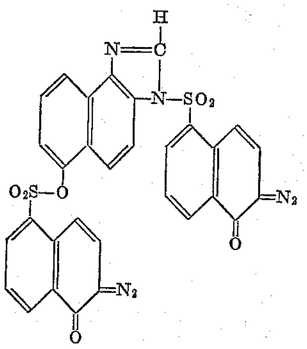

5. A process for developing a printing plate which comprises exposing to light under a master a base material having a compound thereon of the formula

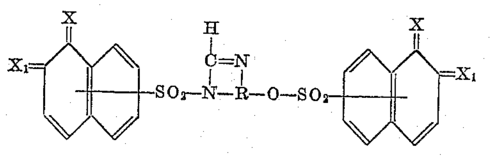

in which X and $X_1$ are selected from the group consisting of $N_2$ and O, those attached to the same ring being different, and R is an arylene group, to thereby form a decomposition product in the light struck areas, and removing the decomposition product by treatment with a weakly alkaline solution.

6. A process for developing a printing plate which comprises exposing to light under a master a base material having a compound thereon of the formula

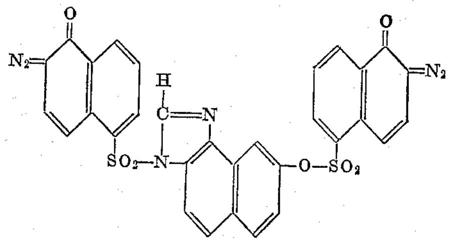

to thereby form a decomposition product in the light struck areas, and removing the decomposition product by treatment with a weakly alkaline solution.

7. A process for developing a printing plate which comprises exposing to light under a master a base material having a compound thereon of the formula

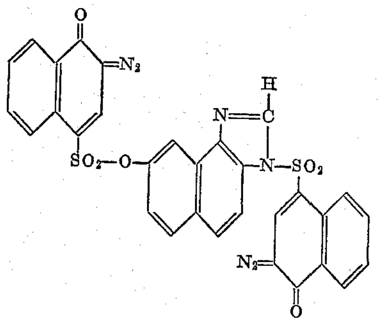

to thereby form a decomposition product in the light struck areas, and removing the decomposition product by treatment with a weakly alkaline solution.

8. A process for developing a printing plate which comprises exposing to light under a master a base material having a compound thereon of the formula

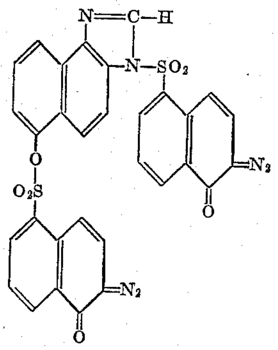

to thereby form a decomposition product in the light struck areas, and removing the decomposition product by treatment with a weakly alkaline solution.

References Cited in the file of this patent

FOREIGN PATENTS

| | | |
|---|---|---|
| 500,222 | Belgium | Jan. 15, 1951 |
| 504,899 | Belgium | Aug. 14, 1951 |
| 508,016 | Belgium | Jan. 15, 1952 |
| 510,151 | Belgium | Apr. 15, 1952 |
| 904,255 | France | Feb. 15, 1945 |
| 872,154 | Germany | Mar. 30, 1953 |
| 879,203 | Germany | June 11, 1953 |

OTHER REFERENCES

PB 1308, Oct. 9, 1945, pages 36–41.
PB 25,781 Microfilm frames 549–550.
PB 17547–S3, abstract of Ger. Application K169,065.